US006744098B2

(12) United States Patent
Moore (10) Patent No.: US 6,744,098 B2
(45) Date of Patent: Jun. 1, 2004

(54) TRANSISTOR DEVICES (75) Inventor: John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/125,979

(22) Filed: Apr. 19, 2002

(65) Prior Publication Data

US 2002/0109199 A1 Aug. 15, 2002

Related U.S. Application Data (62) Division of application No. 09/602,381, filed on Jun. 22, 2000.

(51) Int. Cl.[7] ............................................. H01L 29/72
(52) U.S. Cl. .................... 257/324; 257/325; 257/326; 257/288
(58) Field of Search ........................... 257/288, 289, 257/291, 292, 324, 325, 326

(56) References Cited

U.S. PATENT DOCUMENTS

| 4,605,447 A | 8/1986 | Brotherton et al. |
| 5,026,574 A | 6/1991 | Economu et al. |
| 5,032,545 A | 7/1991 | Doan et al. |

(List continued on next page.)

FOREIGN PATENT DOCUMENTS

| WO | WO 96/39713 | 12/1996 |

OTHER PUBLICATIONS

Wolf, S., "Silicon Processing for the VLSI Era", Lattice Press 1990, vol. 2, pp. 212–213, Jan.
Wolf, S., "Silicon Processing for the VLSI Era", Lattice Press 1990, vol. 2, pp. 188–189, 194–195, 609–614, Jan.
Ko, L. et al., "The Effect of Nitrogen Incorporation into the Gate Oxide by Using Shallow Implantation of Nitrogen and Drive–In Process", IEEE 1996, pp. 32–35, Jan.
Doyle, B. et al., "Simultaneous Growth of Different Thickness Gate Oxides in Silicon CMOS Processing", IEEE vol. 16 (7), Jul. 1995, pp. 301–302.
Kuroi, T. et al., "The Effects of Nitrogen Implantation Into P+Poly–Silicon Gate on Gate Oxide Properties", 1994 Sympos. on VLSI Technology Digest of Technical Papers, IEEE 1994, pp. 107–108.
Liu, C.T. et al., "Multiple Gate Oxide Thickness for 2GHz System–on–a–Chip Technologies", IEEE 1998, pp. 589–592.

*Primary Examiner*—Edward Wojciechowicz
(74) *Attorney, Agent, or Firm*—Wells St. John P.S.

(57) ABSTRACT

The invention encompasses a method of forming silicon nitride on a silicon-oxide-comprising material. The silicon-oxide-comprising material is exposed to activated nitrogen species from a nitrogen-containing plasma to introduce nitrogen into an upper portion of the material. The nitrogen is thermally annealed within the material to bond at least some of the nitrogen to silicon proximate the nitrogen. After the annealing, silicon nitride is chemical vapor deposited on the nitrogen-containing upper portion of the material. The invention also encompasses a method of forming a transistor device. A silicon-oxide-comprising layer is formed over a substrate. The silicon-oxide-comprising layer is exposed to nitrogen from a nitrogen-containing plasma to introduce nitrogen into an upper portion of the layer. The nitrogen is thermally annealed within the layer to bond at least some of the nitrogen silicon proximate the nitrogen. After the annealing, silicon nitride is chemical vapor deposited on the nitrogen-containing upper portion of the layer. At least one conductive gate layer is formed over the silicon nitride, and defines a gate layer. A pair of source/drain regions are formed proximate the gate layer and gatedly connected to one another through a channel region that is beneath the gate layer. Additionally, the invention encompasses transistor device structures.

13 Claims, 4 Drawing Sheets

U.S. PATENT DOCUMENTS

| | | |
|---|---|---|
| 5,164,331 A | 11/1992 | Lin et al. |
| 5,254,489 A | 10/1993 | Nakata |
| 5,258,333 A | 11/1993 | Shappir et al. |
| 5,318,924 A | 6/1994 | Lin et al. |
| 5,330,920 A | 7/1994 | Soleimani et al. |
| 5,334,554 A * | 8/1994 | Lin et al. .................... 256/324 |
| 5,378,645 A | 1/1995 | Inoue et al. |
| 5,382,533 A | 1/1995 | Ahmad et al. |
| 5,436,481 A | 7/1995 | Egawa et al. |
| 5,445,999 A | 8/1995 | Thakur et al. |
| 5,449,631 A | 9/1995 | Giewont et al. |
| 5,464,792 A | 11/1995 | Tseng et al. |
| 5,500,380 A | 3/1996 | Kim |
| 5,518,946 A | 5/1996 | Kuroda |
| 5,518,958 A | 5/1996 | Giewont et al. |
| 5,596,218 A | 1/1997 | Soleimani et al. |
| 5,612,558 A | 3/1997 | Harshfield |
| 5,619,057 A | 4/1997 | Komatsu |
| 5,620,908 A | 4/1997 | Inoh et al. |
| 5,633,036 A | 5/1997 | Seebauer et al. |
| 5,663,036 A | 9/1997 | Conley et al. |
| 5,663,077 A | 9/1997 | Adachi et al. |
| 5,674,788 A | 10/1997 | Wristers et al. |
| 5,685,949 A | 11/1997 | Yashima |
| 5,716,864 A | 2/1998 | Abe |
| 5,719,083 A | 2/1998 | Komatsu |
| 5,760,475 A | 6/1998 | Cronin |
| 5,763,922 A | 6/1998 | Chau |
| 5,834,372 A | 11/1998 | Lee |
| 5,837,592 A | 11/1998 | Chang et al. |
| 5,837,598 A | 11/1998 | Aronowitz et al. |
| 5,840,610 A | 11/1998 | Gilmer et al. |
| 5,861,651 A | 1/1999 | Brasen et al. |
| 5,885,877 A | 3/1999 | Gardner et al. |
| 5,939,750 A | 8/1999 | Early |
| 5,960,289 A | 9/1999 | Tsui et al. |
| 5,960,302 A | 9/1999 | Ma et al. |
| 5,970,345 A | 10/1999 | Hattangady et al. |
| 5,972,783 A | 10/1999 | Arai et al. |
| 5,972,800 A | 10/1999 | Hasegawa |
| 5,994,749 A | 11/1999 | Oda |
| 5,998,253 A | 12/1999 | Loh et al. |
| 6,033,998 A | 3/2000 | Aronowitz et al. |
| 6,054,396 A | 4/2000 | Doan |
| 6,057,220 A | 5/2000 | Ajmera et al. |
| 6,080,629 A | 6/2000 | Gardner et al. |
| 6,080,682 A | 6/2000 | Ibok |
| 6,087,229 A | 7/2000 | Aronowitz et al. |
| 6,091,109 A | 7/2000 | Hasegawa |
| 6,091,110 A | 7/2000 | Hebert et al. |
| 6,093,661 A | 7/2000 | Trivedi et al. |
| 6,110,780 A | 8/2000 | Yu et al. |
| 6,110,842 A | 8/2000 | Okuno et al. |
| 6,114,203 A | 9/2000 | Ghidini et al. |
| 6,136,636 A | 10/2000 | Wu |
| 6,140,187 A | 10/2000 | DeBusk et al. |
| 6,146,948 A | 11/2000 | Wu et al. |
| 6,171,900 B1 | 1/2001 | Sun |
| 6,174,821 B1 | 1/2001 | Doan |
| 6,184,110 B1 | 2/2001 | Ono et al. |
| 6,197,701 B1 | 3/2001 | Shue et al. |
| 6,201,303 B1 | 3/2001 | Ngo et al. |
| 6,207,586 B1 * | 3/2001 | Ma et al. .................... 257/324 |
| 6,225,167 B1 | 5/2001 | Yu et al. |
| 6,228,701 B1 | 5/2001 | Dehm et al. |
| 6,232,244 B1 | 5/2001 | Ibok |
| 6,255,703 B1 | 7/2001 | Hause et al. |
| 6,268,296 B1 | 7/2001 | Misium et al. |
| 6,274,442 B1 | 8/2001 | Gardner et al. |
| 6,297,162 B1 | 10/2001 | Jang et al. |
| 6,323,114 B1 | 11/2001 | Hattangady et al. |
| 6,331,492 B2 | 12/2001 | Misium et al. |
| 6,362,085 B1 | 3/2002 | Yu et al. |
| 6,399,445 B1 | 6/2002 | Hattangady et al. |
| 6,413,881 B1 | 7/2002 | Aronowitz et al. |
| 6,436,771 B1 | 8/2002 | Jang et al. |
| 6,450,116 B1 | 9/2002 | Noble et al. |

\* cited by examiner

TRANSISTOR DEVICES

RELATED PATENT DATA

This patent resulted from a divisional application of U.S. patent application Ser. No. 09/602,381, which was filed on Jun. 22, 2000.

TECHNICAL FIELD

The invention pertains to methods of forming silicon nitride, and particularly pertains to methods of forming silicon nitride over silicon-oxide-comprising materials. The invention also pertains to methods of forming transistor devices, and further pertains to transistor device structures.

BACKGROUND OF THE INVENTION

There are numerous semiconductor processing applications in which it is desired to form a silicon-nitride-comprising layer over a silicon-oxide-comprising layer. For instance, it can be desired to form transistor devices having silicon nitride and silicon oxide as dielectric materials between a conductive gate and a channel region. A difficulty in forming silicon nitride over silicon oxide is described with reference to FIGS. 1 and 2.

Figure 1:
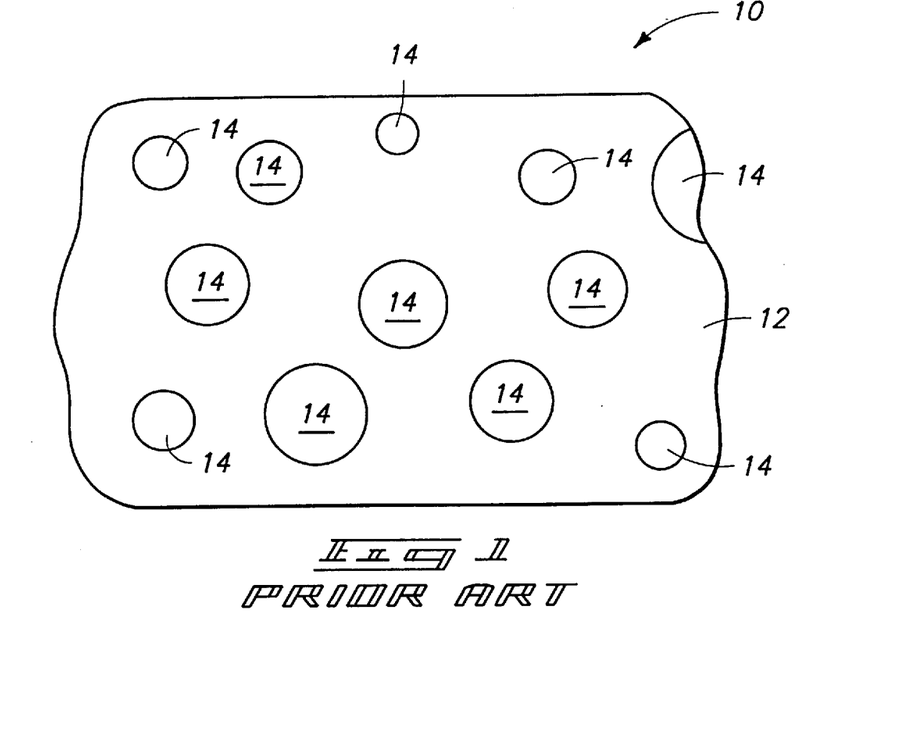
FIG. 1 is a diagrammatic, fragmentary, top view of a semiconductor wafer fragment at a preliminary step of a prior art processing sequence.

Referring initially to FIG. 1, a top view of a fragment of a semiconductor structure is shown. Fragment 10 comprises an oxide surface 12 upon which nitride 14 is to be formed. Oxide surface 12 can comprise, for example, silicon dioxide; and nitride 14 can comprise, for example, silicon nitride ($Si_3N_4$). The silicon nitride can be deposited by, for example, chemical vapor deposition. A problem is that the silicon nitride does not deposit readily on silicon dioxide, because there are only a few bonds available for bonding of nitrogen to silicon in silicon dioxide. Accordingly, the silicon nitride forms in small localized islands. The islands grow, and eventually merge to form a silicon nitride surface 14 that entirely covers silicon oxide 12. Such silicon nitride surface is shown in FIG. 2.

Figure 2:
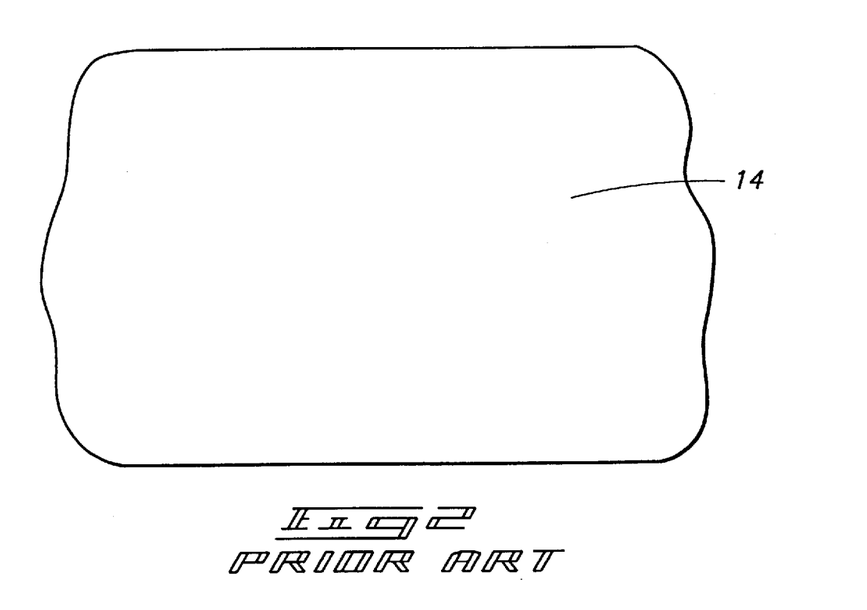
FIG. 2 is a view of the FIG. 1 wafer fragment shown at a prior art processing step subsequent to that of FIG. 1.

The silicon nitride material that ultimately forms the surface of FIG. 2 will typically be from about 30 to 35 Å thick, and will frequently be non-uniform in thickness as it was formed from the merger of relatively thick islands (frequently the islands are about 28 Å thick when they merge) so that the portions where edges of the islands merged are thinner than portions corresponding to centers of the islands. Further, it can be difficult to control the overall thickness of nitride material 14, as it is difficult to control how thick the islands of FIG. 1 will be when they finally merge.

It would be desirable to develop new methods of forming silicon nitride which overcome some or all of the above-discussed problems.

SUMMARY OF THE INVENTION

In one aspect, the invention encompasses a method of forming silicon nitride on a silicon-oxide-comprising material. The silicon-oxide-comprising material is exposed to activated nitrogen species from a nitrogen-containing plasma to introduce nitrogen into an upper portion of the material. The nitrogen is thermally annealed within the material to bond at least some of the nitrogen to silicon proximate the nitrogen. After the annealing, silicon nitride is chemical vapor deposited on the nitrogen-containing upper portion of the material.

In another aspect, the invention encompasses a method of forming a transistor device. A silicon-oxide-comprising layer is formed over a substrate. The silicon-oxide-comprising layer is exposed to activated nitrogen from a nitrogen-containing plasma to introduce nitrogen into an upper portion of the layer. The nitrogen is thermally annealed within the layer to bond at least some of the nitrogen to silicon proximate the nitrogen. After the annealing, silicon nitride is chemical vapor deposited on the nitrogen-containing upper portion of the layer. At least one conductive gate layer is formed over the silicon nitride, and defines a gate layer. A pair of source/drain regions are formed proximate the gate layer and gatedly connected to one another through a channel region that is beneath the gate layer.

In yet another aspect, the invention encompasses transistor device structures.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method of the present invention is described with reference to FIGS. 3–9.

Figure 3:
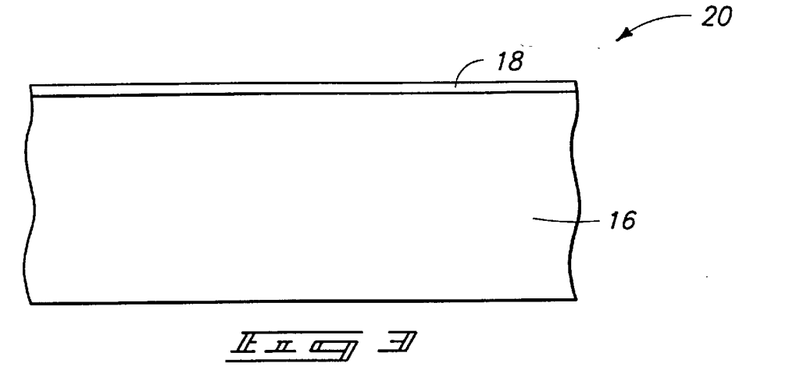
FIG. 3 is a diagrammatic, cross-sectional view of a semiconductor wafer fragment at a preliminary step of a method of the present invention.

Referring initially to FIG. 3, a wafer fragment 20 is illustrated. Fragment 20 comprises a substrate 16 having an oxide layer 18 formed thereover. Substrate 16 can comprise, for example, a bulk semiconductive material substrate such as, for example, monocrystalline silicon lightly doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials).

The term "substrate" refers to any supporting structure, including, but not limited to, the semiconductive substrates described above.

Oxide layer 18 can be formed over substrate 16 by, for example, chemical vapor deposition of silicon dioxide. Alternatively, oxide layer 18 can correspond to a thin layer of native oxide resulting from exposure of substrate 16 to air or other sources of oxygen. If layer 18 corresponds to native oxide, it can correspond to a layer less than or equal to approximately 5 Å thick, and comprising silicon dioxide. Layer 18 can also consist essentially of silicon dioxide, or consist of silicon dioxide. In particular embodiments of the invention, layer 18 can have a thickness of from about 1 Å to about 50 Å, such as, for example, a thickness of about 40 Å.

Figure 4:
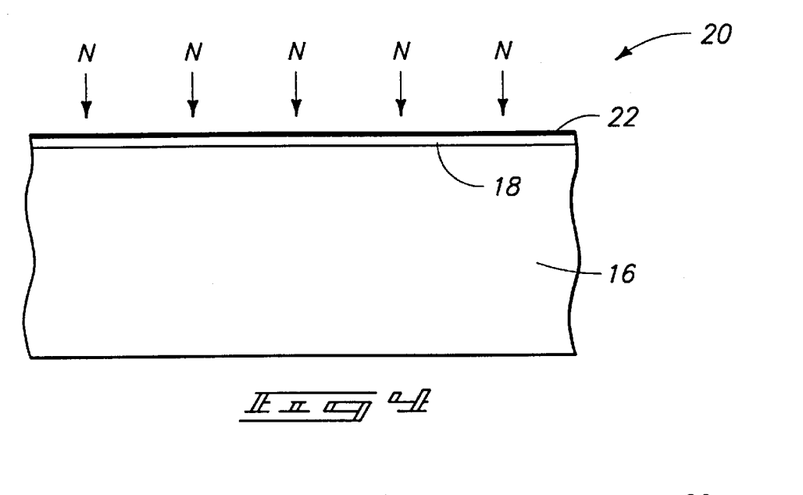
FIG. 4 is a view of the FIG. 3 wafer fragment shown at a processing step subsequent to that of FIG. 3.

FIG. 4 illustrates a nitrogen-comprising region 22 being formed on and/or within oxide layer 18. Nitrogen-comprising region 22 is a thin layer formed by exposing silicon-oxide comprising material 18 to an activated nitrogen species formed from a nitrogen-containing plasma, with the term "activated" indicating that the nitrogen species is different than the form of nitrogen fed to the plasma. An activated nitrogen species can comprise, for example, a nitrogen ion or a nitrogen atom in an energy state higher than its ground state.

An exemplary method of providing nitrogen within oxide layer 14 is to expose layer 18 to a nitrogen-containing plasma and thereby introduce nitrogen into layer 18. Such introduction forms nitrogen-enriched upper region 22 of layer 18 and leaves a non-nitrogen-enriched region beneath the nitrogen-enriched upper region. The nitrogen-enriched upper portion of oxide layer 18 can be formed within the top 2 Å of layer 18. If oxide layer 18 is less than or equal to about 5 Å thick, nitrogen-enriched upper portion 22 preferably does not extend below the top half of layer 18. If oxide layer 18 is at least 10 Å thick, nitride-enriched portion 22 is preferably at least about 5 Å above substrate 16, and more preferably only within the top 5 Å of layer 18. It can be advantageous to keep the nitrogen above an upper surface of substrate 16 to avoid having the nitrogen migrate into upper surface 16 and disrupt operation formed in and/or over a surface of substrate 16. It is to be understood, however, that the invention encompasses embodiments wherein nitrogen migration into a surface of substrate 16 is acceptable, and in such embodiments the nitrogen-enriched portion of layer 18 can extend throughout an entirety of layer 18.

The nitrogen-containing plasma can be formed from, for example, $N_2$, $NH_3$ and/or $N_2O$. The plasma can be predominantly composed of nitrogen-containing species, consist essentially of nitrogen-containing species, or consist entirely of nitrogen-containing species. In exemplary embodiments, layer 18 is maintained at a temperature of less than or equal to 200° C. during the exposure to the nitrogen-containing plasma. Such can alleviate diffusion of nitrogen into a lower half of oxide layer 18. Particular exemplary temperatures can be from 50° C. to 200° C., with a suitable temperature being about 65° C. The nitrogen-containing plasma can be maintained with a power of from about 500 watts to about 5,000 watts during exposure of layer 18 to the plasma, and in particular embodiments can be maintained with a power of from about 500 watts to about 3,000 watts during the exposing. A pressure within a reaction chamber comprising the plasma and oxide layer 18 can be less than 3 Torr. The time of exposure of layer 14 to the nitrogen-containing plasma is preferably for a time of less than or equal to about 1 minute, and in particular embodiments can be for a time of from about 3 seconds to about 1 minute. An exemplary process utilizes an exposure time of from about 10 seconds to about 15 seconds.

Figure 8:
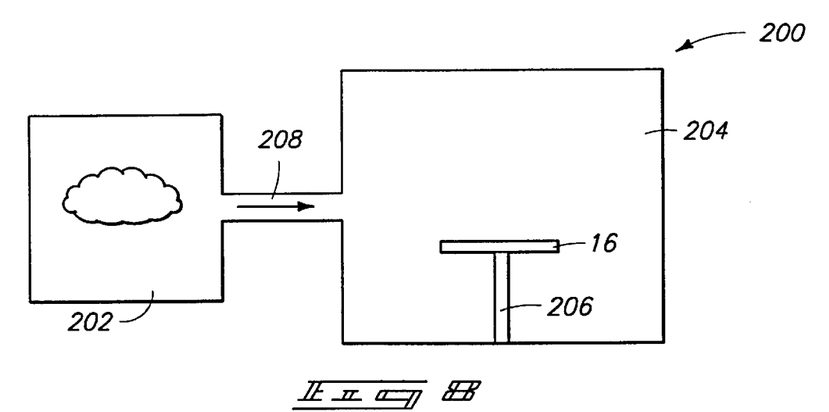
FIG. 8 is a diagrammatic, cross-sectional view of an apparatus which can be utilized in methodology of the present invention.
Figure 9:
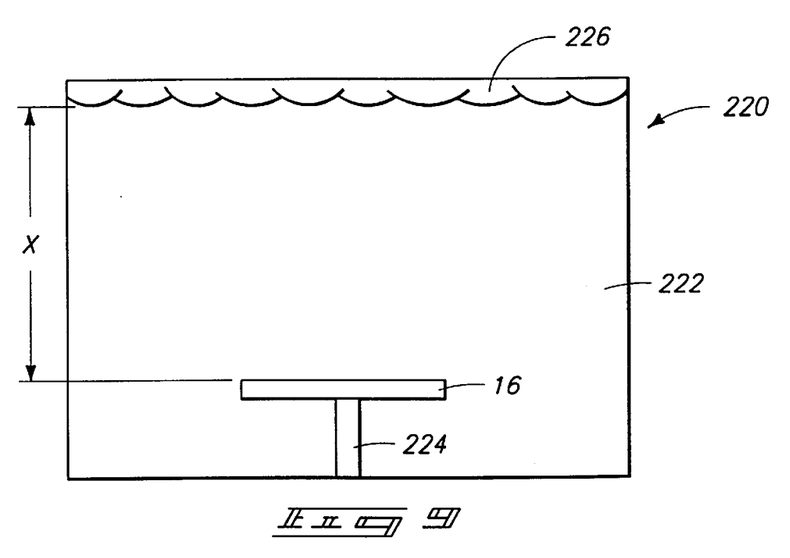
FIG. 9 is a diagrammatic, cross-sectional view of another apparatus which can be utilized in methodology of the present invention.

FIGS. 8 and 9 illustrate exemplary apparatusses which can be utilized for forming nitrogen-comprising region 22.

Referring initially to FIG. 8, a remote plasma nitridization apparatus 200 is illustrated. Apparatus 200 comprises a plasma chamber 202 and a reaction chamber 204. Reaction chamber 204 comprises a substrate holder 206, and substrate 16 is supported within chamber 204 by holder 206. Preferably, holder 206 is configured to rotate substrate 16 during exposure of substrate 16 to activated nitrogen species. Such activated nitrogen species are formed within plasma chamber 202 by, for example, exposing $N_2$ and/or other nitrogen-containing materials (such as $N_2O$ or $NH_3$) to plasma conditions. Exemplary plasma conditions comprise utilization of a microwave plasma generator at a power of from about 1,500 watts to about 3,000 watts, and utilizing a pressure within chamber 202 of less than 3 Torr. The plasma of chamber 202 forms activated nitrogen species which migrate along a passageway 208 into chamber 204 whereupon the species can form nitrogen-comprising layer 22 (FIG. 4) over and/or within oxide 18 (FIG. 4).

An arrow is shown within passageway 208 to indicate migration of plasma activated nitrogen species through passageway 208. Preferably, passageway 208 is of sufficient length so that plasma 202 is at least about 12 inches from substrate 16. Such can enable highly activated nitrogen species formed within a plasma to relax prior to interaction with substrate 16, which can limit penetration of the nitrogen species into substrate 16 relative to an amount of penetration which would occur with more highly activated species. In order to further limit penetration of nitrogen species into substrate 16, substrate 16 is preferably not biased relative to the plasma within chamber 202.

Suitable operating conditions for forming a nitrogen-comprising plasma over substrate 16 can include maintaining a temperature of substrate 16 at from about 550° C. to about 1,000° C., rotating the wafer comprising substrate 16 at about 90 rotations per minute (RPM), maintaining a pressure within chambers 202 and 204 of from about 0.8 Torr to about 2.8 Torr, and exposing the wafer to the nitridization conditions for from about one minute to about five minutes.

Referring next to FIG. 9, an alternative apparatus which can be utilized for forming nitrogen over and within oxide layer 18 (FIG. 4) is illustrated as apparatus 220. Apparatus 220 can be referred to as a high density plasma remote plasma nitridization (HDP-RPN) apparatus, or simply as a plasma nitridization (PN) apparatus. Apparatus 220 comprises a reaction chamber 222 having a wafer holder 224 therein. Wafer 16 is supported on holder 224. A plasma 226 is formed above substrate 16, and preferably is maintained a distance "X" from substrate 16, with distance "X" corresponding to at least about four inches. Nitrogen is introduced into plasma 226 in the form of, for example, $N_2$, and activated nitrogen species are formed from the nitrogen. Suitable processing parameters for utilization of the apparatus of FIG. 9 include a wafer temperature of from 0° C. to 400° C., no rotation of the substrate 16, a pressure within chamber 222 of from about 5 mTorr to about 15 mTorr (preferably of from about 5 mTorr to about 10 mTorr), and an exposure time of substrate 16 to activated nitrogen species within chamber 222 of from about 5 seconds to about 30 seconds.

The plasma treatment described above with reference to FIGS. 8 and 9 preferably forms a minimum of about 5% nitrogen within the upper surface silicon dioxide of layer 18. The nitrogen formed within such upper surface is then thermally annealed to bond at least some of the nitrogen, and preferably all of the nitrogen, to silicon proximate the nitrogen. The thermal bonding of the nitrogen alleviates diffusion of the nitrogen through layer 18 (FIG. 4) and into substrate 16 (FIG. 4). The annealing can comprise thermal processing at a temperature of less than 1,100° C. for a time of at least 3 seconds, and can comprise, for example, a temperature of 700° C. for at time of about 30 seconds, or 1,050° C. for a time of about 5 seconds. Alternatively, the annealing can comprise rapid thermal processing (RTP) utilizing a ramp rate of at least 50° C./second to a temperature of less than 1,000° C., with such temperature being maintained for at least about 30 seconds. Suitable processing can include a temperature of about 900° C. for at time of about 60 seconds.

After the thermal annealing of the nitrogen, the nitrogen of the nitrogen-enriched upper portion of oxide layer 18 can be entirely within the top 5 Å of layer 18. More specifically, if oxide layer 18 is at least 10 Å thick, the nitride-enriched portion is preferably at least about 5 Å above substrate 16, and more preferably only within the top 5 Å of layer 18 after the thermal annealing of the nitrogen. It can be advantageous to keep the nitrogen above an upper surface of substrate 16 to avoid having the nitrogen migrate into upper surface 16 and disrupt operation of a channel region ultimately formed in substrate 16. It is to be understood, however, that the invention encompasses embodiments wherein nitrogen migration into a surface of substrate 16 is acceptable, and in such embodiments the nitrogen-enriched portion of layer 18 can extend throughout an entirety of layer 18 after the thermal annealing.

Figure 5:
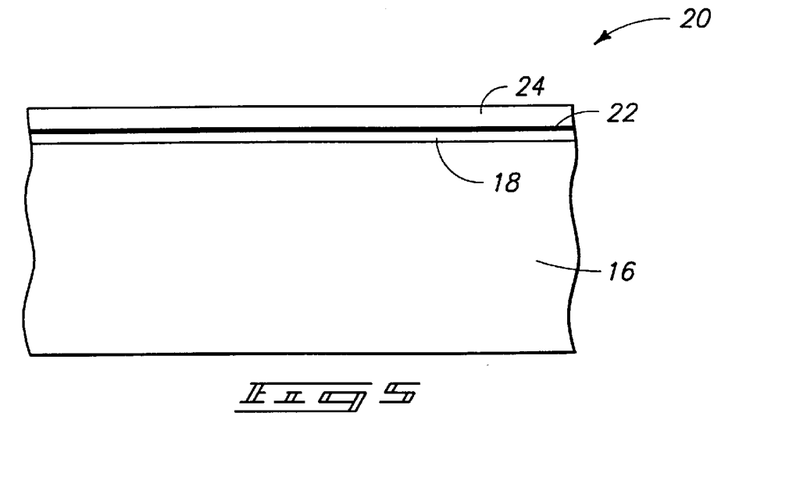
FIG. 5 is a view of the FIG. 3 wafer fragment shown at a processing step subsequent to that of FIG. 4.

Referring to FIG. 5, a layer 24 of silicon nitride is chemical vapor deposited over nitrogen-enriched portion 22 of silicon dioxide layer 18. An exemplary process for the chemical vapor deposition of silicon nitride includes utilization of $NH_3$ and dichlorosilane as silicon nitride precursors, a temperature of from about 600° C. to about 800° C., a pressure of from about 0.1 Torr to about 2 Torr, and a time of from about 10 minutes to about 100 minutes. Silicon-enriched portion 22 provides a surface upon which silicon nitride (for example, $Si_3N_4$) can be uniformly and controllably deposited. Layer 24 can thus be deposited to have a substantially planar upper surface, and accordingly a uniform thickness throughout. Further, the final thickness of layer 24 can be controllably determined. Preferably, layer 24 is formed to a thickness of from about 30 Å to about 50 Å, and in an exemplary embodiment is formed to a thickness of about 40 Å over a 5 Å thick silicon dioxide layer 18. In one aspect of the present invention, layers 18, 22 and 24 are utilized as a dielectric material beneath a transistor gate. Preferably, such dielectric material will provide a drive current comparable to that provided by a conventional gate oxide layer (i.e., by a gate dielectric material that consists essentially of silicon dioxide). Conventional gate oxide layers are typically from about 35 Å thick to about 50 Å thick. Since silicon nitride has a higher dielectric constant than silicon dioxide the dielectric material corresponding to layers 24, 22 and 18 will be formed thicker than a dielectric material consisting of silicon dioxide to have the same drive current as the material consisting of silicon dioxide. For instance, in an embodiment in which silicon dioxide layer 18 has a thickness of about 10 ÅÅ, layer 22 has a negligible thickness (i.e., less than about 5 Å), and layer 24 has a thickness of about 40 Å; the composite layer formed from materials 18, 22 and 24 can be utilized in a transistor to accomplish a drive current corresponding approximately to that of a 35 Å thick dielectric material consisting of silicon dioxide.

An advantage of utilizing silicon nitride within a gate dielectric material is that the silicon nitride enables the gate dielectric material to be thicker than if the material consisted of silicon dioxide, and yet to accomplish the same drive current as a dielectric material consisting of silicon dioxide. The thicker layer will be less affected by minor variations in thickness than would a thin layer. Accordingly, utilization of a thicker dielectric material comprising silicon nitride relative to a thinner material consisting of silicon dioxide can reduce tolerances of semiconductor processing steps, and accordingly reduce instances of device failure.

Figure 6:
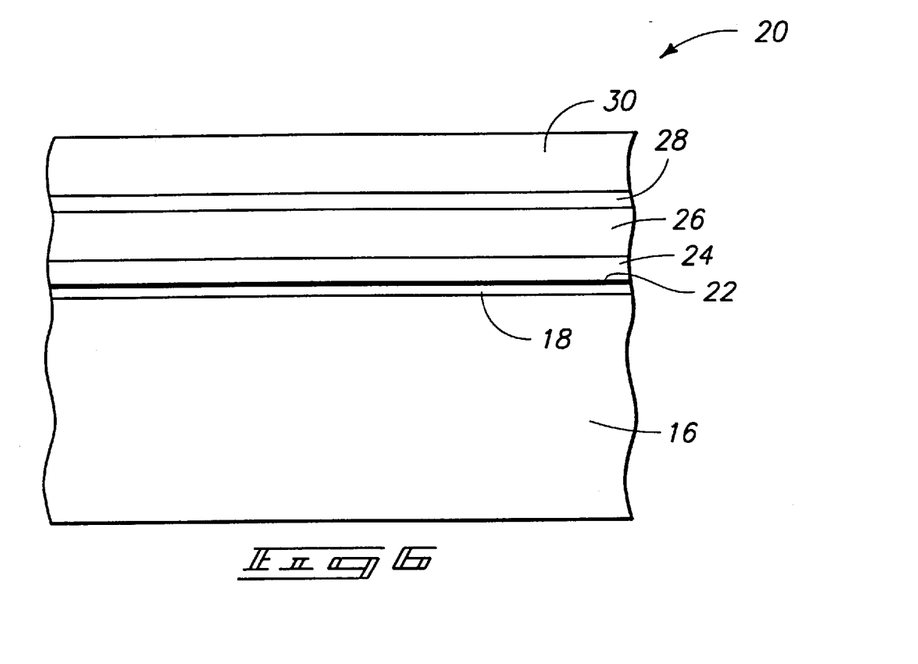
FIG. 6 is a view of the FIG. 3 wafer fragment shown at a processing step subsequent to that of FIG. 5.
Figure 7:
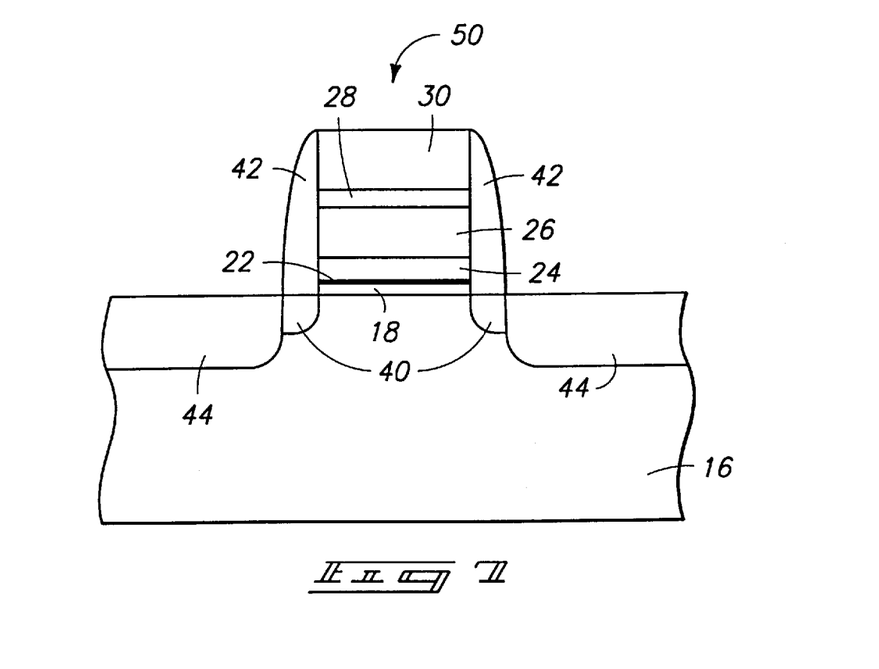
FIG. 7 is a view of the FIG. 3 wafer fragment shown at a processing step subsequent to that of FIG. 6.

FIGS. 6 and 7 illustrate methodology for forming a transistor device incorporating the composite dielectric material of layers 18, 22 and 24. Referring to FIG. 6, layers 26, 28 and 30 are formed over layer 24. Layers 26, 28 and 30 can correspond to, for example, conductively doped silicon, metal silicide, and insulative dielectric materials, respectively. More specifically, layer 26 can correspond to conductively doped silicon which is doped with either n-type or p-type dopant, and can correspond to, for example, conductively doped polycrystalline silicon or conductively doped amorphous silicon. Layer 28 can correspond to, for example, titanium silicide or tungsten silicide, and layer 30 can correspond to silicon nitride or silicon dioxide.

Referring to FIG. 7, layers 18, 22, 24, 26, 28 and 30 are patterned into a gate structure of a transistor device 50. Layers 18, 22 and 24 correspond to a dielectric material under conductive gate material 26, and a channel region is defined to be beneath conductive material 26 and in the semiconductive material of substrate 16.

Lightly doped diffusion regions 40 are formed within substrate 16 and proximate the channel region. Lightly doped diffusion regions 40 can comprise either n-type dopant or p-type depending on the type of transistor device 50 (i.e., depending on whether the transistor device 50 corresponds to a PMOS or NMOS transistor).

Sidewall spacers 42 are formed adjacent sidewalls of the gate structure, and over lightly doped diffusion regions 40. Sidewall spacers 42 can be formed by conventional methods, such as, for example, by depositing an insulative material over substrate 16 and subsequently anisotropically etching the insulative material to define spacers 42. A suitable insulative material for spacers 42 is either silicon nitride or silicon dioxide.

Heavily doped source/drain regions 44 are formed within substrate 16, and are formed to be gatedly connected by the gate comprising conductive materials 26 and 28. Source/drain regions 44 can be more heavily doped with either n-type dopant or p-type dopant, depending on whether device 50 is to be an NMOS device or a PMOS device. Heavily doped regions 44 will typically comprise at least $1 \times 10^{19}$ atoms/cm$^3$ of conductivity enhancing dopant.

The relative thicknesses of 18, 22, 24, 26, 28 and 30 are shown diagrammatically, and not in proportion to the thicknesses of such layers in actual devices. In particular devices, layer 18 can comprise a thickness less than or equal to about 10 Å, and can, for example, comprise a thickness of less than or equal to about 5 Å. Layer 22 will have a negligible thickness, and will be formed within an upper portion of layer 18. Layer 22 can, for example, comprise a thickness of from about 1 Å to about 2 Å. Silicon nitride layer 24 can comprise a thickness of greater than or equal to 30 Å, and in particular embodiments will comprise a thickness of at least about 40 Å, and can, for example, comprise a thickness of at least about 50 Å.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A transistor device, comprising:
   a silicon-oxide-comprising material over a substrate, the silicon-oxide-comprising material having thickness of less than or equal to about 50 Å, wherein a first portion of the thickness is nitrogen-enriched relative to a second portion of the thickness;
   a silicon-nitride-comprising material on the silicon-oxide-comprising layer, the silicon-nitride-comprising material having a thickness of at least 30 Å, the silicon-nitride-comprising material being different than the silicon-oxide-comprising material;
   at least one conductive gate layer on the silicon-nitride-comprising material, the gate layer defining a channel region in the substrate beneath the silicon-oxide-comprising material; and
   a pair of source/drain regions proximate the gate layer.

2. The device of claim 1 wherein the second portion of the thickness of the silicon-oxide-material material does not comprise nitrogen.

3. The device of claim 1 wherein the silicon-nitride-comprising material has a thickness of at least about 40 Å.

4. The device of claim 1 wherein the silicon-oxide-comprising material has a thickness of 5 Å or less.

5. The device of claim 1 wherein the silicon-nitride-comprising material has a thickness of at least about 40 Å, and wherein the silicon-oxide-comprising material has a thickness of 5 Å or less.

6. The device of claim 1 wherein the substrate comprises monocrystalline silicon, and wherein the source/drain regions are conductively doped diffusion regions within the substrate.

7. The device of claim 1 wherein the silicon-oxide-comprising material has a thickness of less than or equal to about 40 Å.

8. The device of claim 1 wherein the silicon-oxide-comprising material has a thickness of less than or equal to about 10 Å.

9. The device of claim 1 wherein the second portion of the thickness of the silicon-oxide comprising material is greater than the first portion of the thickness of the silicon-oxide comprising material.

10. The device of claim 1 wherein the first portion of the thickness of the silicon-oxide-comprising material is less than or equal to 5 Å thick and the second of the thickness of the silicon-oxide comprising material does not comprise nitrogen.

11. A transistor devise comprising;
    a semiconductor substrate;
    a silicon dioxide layer over the semiconductor substrate, the silicon dioxide layer having an upper portion comprising a greater amount of nitrogen than a lower protion of the silicon dioxide leayer, the upper potion comprising at least 5% nitrogen;
    a silicon nitride layer over the upper portion of the silicon dioxide layer,
    a conductive layer over the silicon nitride layer; and
    an insulative layer over the conductive layer, the silicon dioxide layer, the silicon nitride layer, the conductive layer and the insulative layer being patterned into a gate structure.

12. The device of claim 11 wherein the lower portion of the silicon dioxide layer is substantially free of nitrogen.

13. The device of claim 11 wherein at least some of the nitrogen in the upper portion is bonded to silicon within the silicon dioxide layer.

* * * * *

UNITED STATES PATENT AND TRADEMARK OFFICE
CERTIFICATE OF CORRECTION

PATENT NO. : 6,744,098 B2
DATED : June 1, 2004
INVENTOR(S) : Moore

It is certified that error appears in the above-identified patent and that said Letters Patent is hereby corrected as shown below:

Title page,
Item [56], References Cited, U.S. PATENT DOCUMENTS, insert
-- 6,207,532 B1    3/2001      Lin et al.
   6,410,991 B1    6/2002      Kawai et al.
   6,482,690 B2    11/2002     Shibata et al.
   6,492,690 B2    12/2002     Ueno et al.
   6,399,448 B1    6/2002      Mukhopadhyay et al.
   2003/0034518 A1 2/2003      Yoshikawa --.

Column 5,
Line 64, replace "ÅA" with -- Å --.

Column 7,
Line 16, after "having" insert -- a --.

Column 8,
Line 17, after "second" insert -- portion --.
Line 25, replace "leayer" with -- layer --.
Line 25, replace "potion" with -- portion --.

Signed and Sealed this

Fourth Day of January, 2005

JON W. DUDAS
*Director of the United States Patent and Trademark Office*